United States Patent

Netherwood

[15] 3,684,818

[45] Aug. 15, 1972

[54] MULTI-LAYER BEAM-LEAD WIRING FOR SEMICONDUCTOR PACKAGES

[72] Inventor: Paul H. Netherwood, Williamstown, Mass.

[73] Assignee: Sprague Electric Company, North Adams, Mass.

[22] Filed: Oct. 20, 1970

[21] Appl. No.: 82,286

[52] U.S. Cl...............174/52 S, 29/627, 174/DIG. 3, 317/101 A, 317/101 CP, 317/234 G

[51] Int. Cl...........................................H05k 5/06

[58] Field of Search............174/DIG. 3, 52 S, 52 PE; 317/101 A, 101 CP, 234 G; 29/627

[56] References Cited

UNITED STATES PATENTS

| | | | |
|---|---|---|---|
| 3,390,308 | 6/1968 | Marley | 174/DIG. 3 UX |
| 3,544,857 | 12/1970 | Byrne et al. | 174/DIG. 3 UX |

OTHER PUBLICATIONS

" Technical Description of Interconnection System for Motorola Main–Frame Semiconductor Memory," Pub. Motorola, Inc. 11/19/69, 3 pp.

*Primary Examiner*—Darrell L. Clay

*Attorney*—Connolly and Hutz and Vincent H. Sweeney

[57] ABSTRACT

A ceramic package having Kapton reverse beam leads with two sided wiring boards, plated thru holes, and pinouts on the exterior of the package. This package is bound together with preformed sheet adhesive and heat bonded together as are standard packages, but at a lower temperature. The leads are part of the interconnecting pattern and can be made as one piece, and eliminates many connections from inside to outside the package.

4 Claims, 5 Drawing Figures

PATENTED AUG 15 1972 3,684,818

MULTI-LAYER BEAM-LEAD WIRING FOR SEMICONDUCTOR PACKAGES

BACKGROUND OF THE INVENTION

This invention relates to multi-layer beam lead wiring for semiconductor packages, and more particularly to a non-rigid plastic-to-ceramic package utilizing reverse beam leads that allow running the wiring over or under a chip. The package is sealed with an epoxy resin forming a package that will pass the Mil tests.

Integrated circuits have been packaged in many and various types of containers. There have been many flat pack containers, as well as others. Some problems encountered in the area are: the packages are very bulky, and usually rather rigid, thereby restricting their uses somewhat; they require many manual steps in their fabricating process, and are consequently very costly to produce.

Recently, beam lead techniques have been employed in the design of flat pack ceramic packages containing integrated circuits. Some problems encountered here include the necessity of having to make numerous man-made connections. This leads to a strong likelihood of error, and a resultingly lower reliability factor and higher costs.

Accordingly, it is an object of the present invention to provide a compact, economical means of interconnection integrated circuit chips.

Another object of the invention is to provide a flat pack ceramic device that utilizes reverse beam leads and a low cost substrate that yields shorter distances and tight packing densities.

Still another object of the invention is to provide pinouts and plated thru holes that are on exterior beam leads that are better protected and much stronger than those employed in prior art forms.

SUMMARY OF THE INVENTION

A plastic to ceramic package is formed wherein an integrated circuit die is mounted and bonded to a ceramic substrate; a preform ring of epoxy is placed on the substrate, and a sheet of plastic having holes that are cut or etched thereon and having a network of beam leads and interconnecting points is dropped on the die, and internal connections are made by welding; then another piece of epoxy preform is mounted on the package. Multi-layer sheets can be stacked as desired. The package is capped with ceramic and held together with the epoxy preform with the aid of heat, forming a simple, economical, high efficiency, and high reliability device that will pass the Mil tests.

The wiring used here can run over the surface of the chip on the top and on the bottom of glassivated or otherwise insulated chips. Therefore, the speed of the chips can be fully utilized because it is not necessary to run around the chip or group the chips.

The beams involved here extend from the interconnecting pattern to the chip bonding pads to outside the package. The beams are held at both ends—to the chip and to substrate conductors—and are stronger. This is especially important on exterior beam leads where the connection is made to the package. In normal construction they stick out unprotected.

This type of construction gives a denser packing of chips, sturdier parts, and consequently lower cost. Also contributing to the lower cost is the fact that all bonds are made simultaneously in one operation, and the number of man-made connections is reduced.

Concerning the repairability of the device, broken beams can be replaced individually or by an entire beam preform, and the leads can be bent or disconnected as necessary, and bad chips can be replaced.

By using copper with a 25 percent stretch it is possible that with slightly larger holes the top bond could be welded at the bottom layer, and the total thickness of the copper and the polyimide sheet is only 0.002 inch. This would reduce the number of thru plated holes required, and increase its reliability and economy.

Beam lead dies are etched apart, but reverse beam-lead dies can be cut, thereby making the operation more profitable. The whole package is less bulky, can be bent to suit the use, and costs much less than prior packages.

A package is produced wherein the leads are part of the interconnecting pattern, that can be made as one piece, and removes many connections from inside the package to outside the package. It has good heat transfer, is low cost, and the leads are very tough as they are attached to the plastic sheet.

DETAILED DESCRIPTION OF PREFERRED EMBODIMENTS

Figures 1, 2:
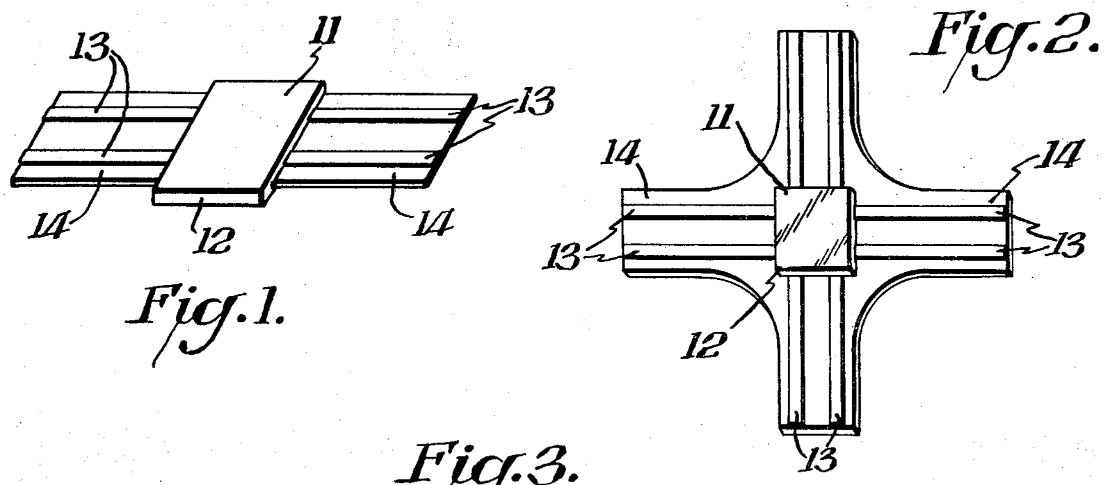
FIG. 1 is a perspective view of an embodiment of the invention.
FIG. 2 is a perspective view of another embodiment of the invention.

Referring to FIG. 1, there is shown a plastic substrate 14 having copper laminated beam leads 13 extending out from alternate sides of the ceramic package 11 that is bound together with an epoxy resin 12.

Referring to FIG. 2, there is shown a plastic substrate 14 having copper laminated beam leads 13 extending out from all sides of the ceramic package 11 that is bound together with an epoxy resin 12.

Figure 3:
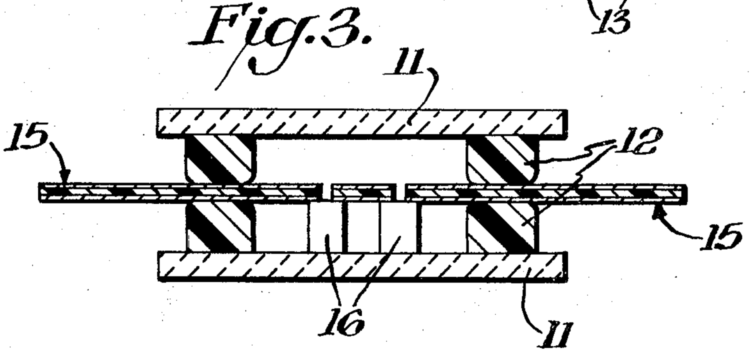
FIG. 3 is a sectional view of the embodiment shown in FIG. 1.

Referring to FIG. 3, there is shown a plastic substrate with copper laminated beam leads on both sides 15 going into and attaching onto, by welding, integrated circuit dies 16 which are mounted on the ceramic substrate 11. The beam leads 15 are interconnecting the integrated circuit dies 16 and extend out the exterior of the ceramic package 11. The package 11 is held together with an epoxy resin 12.

Figure 4:
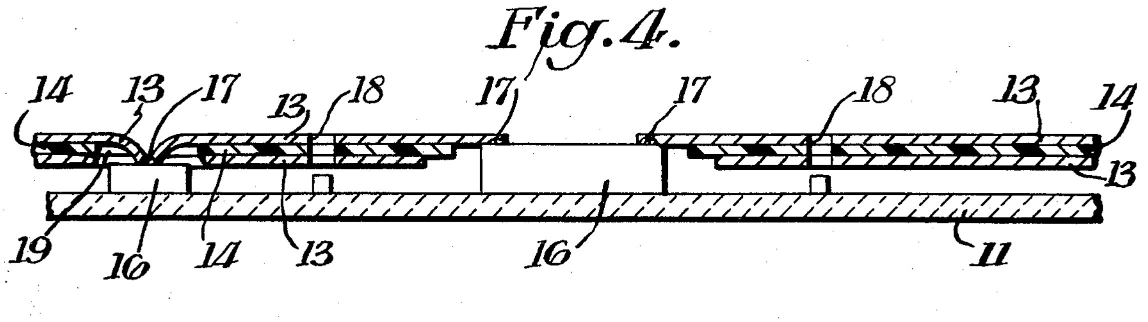
FIG. 4 is an enlarged view in cross-section of part of a ceramic substrate showing some possible welding areas within the package.

Referring to FIG. 4, there is shown a ceramic substrate 11 having integrated circuit dies 16 mounted thereon. The copper beam leads 13 are welded 17 onto the integrated circuit chips 16. Plated thru holes 18 are available on the plastic substrate for further connections as required. Additionally, it is possible with slightly larger holes that the top bond 13 could be welded at the bottom layer. The total thickness of the bottom copper and the plastic sheet is only 0.002 inch and the bend is not very large so that the copper is not greatly stretched in a 0.010 inch hole, for example. The copper used here has about a 25 percent stretch. This process would reduce the number of thru plated holes required, and in some simple repeat patterns, they could be eliminated entirely.

The variations to which this package may be subjected, as well as the variety of materials which may be used is almost endless.

The plastic substrate 14 used will vary according to two principal factors; that is the temperature range and mechanical strength which must be possessed by the chosen substrate. All plastics considered for use must be capable of being decomposed or disintegrated chemically.

In the preferred embodiment, the plastic substrate 14 is the polyimide film, Kapton. This substance is polypyromellitimide and results from the polycondensation reaction between pyromellitic dianhydride and an aromatic diamine. It has broad range temperature stability and a tensile strength of about 25,000 psi. Additionally, although Kapton resists attack from organic solvents, strong inorganic alkaline solutions will attack it. This is a necessary characteristic feature of any plastic substrate chosen. Other plastics that could be used although they have less desirable characteristics, include polyethers, polyesters, polyamides, and other polyimides.

The package substrate 11 itself is also subject to variation. The biggest considerations here are toughness and heat transfer. If heat transfer is the only consideration, then a metal such as copper or silver may make the best package. If toughness is a consideration, then one may choose a low purity alumina or a plastic material for packaging purposes. Other adequate, though less desirable, ceramic materials, include berylia and some titanates.

In the preferred embodiment, the packaging substrate is a ceramic. This substance has good heat transfer and is tough enough for most desired uses. Additionally, and perhaps most importantly, the chips or dies to be used within this package must be isolated, and to isolate, you must necessarily use insulating substrates. The ceramic substrate employed herein is an insulating material.

Figure 5:
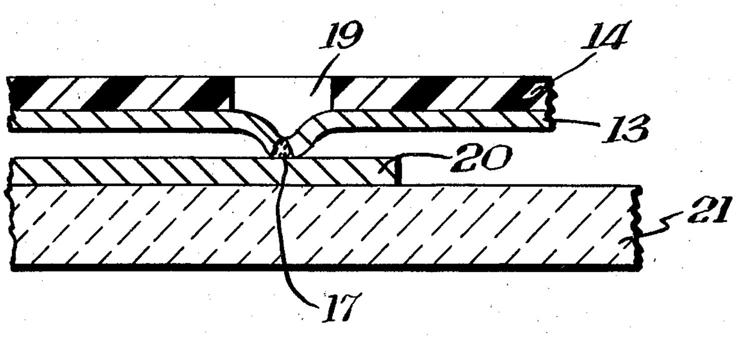
FIG. 5 is an enlarged view in section of exterior beam lead attaching onto metal "mother" board.

Referring to FIG. 5, there is shown a section of a "-mother" board 21 onto which is welded an exterior portion of the reverse beam lead. This is carried out rather simply. The copper laminated 13 plastic substrate 14 extends out from the package and is welded at 17 thru holes 19 on said lead onto a copper bonding base 20 that has been attached to a "mother" board 21 which is a metallic material.

One may wish to tin plate the copper surface 13 to to facilitate attaching same to the bonding base 20, or you may weld the connection together as described above.

Modifications and variations can be made in the embodiments illustrated and described without departing from the spirit or scope of my invention.

What is claimed is:

1. A packaged semiconductor device comprising a non-rigid plastic substrate, copper wiring strips bonded on both sides of said plastic substrate providing therewith a reverse beam lead wiring unit, a ceramic substrate having at least one integrated circuit chip mounted thereon, at least one of said copper strips of said wiring unit being conductively bonded to a terminal on said circuit chip, said wiring unit being bonded to said ceramic substrate around said circuit chip by a first insulating resin member, a ceramic cap being bonded to said wiring unit opposite said ceramic substrate by a second insulating resin member, said ceramic substrate and said ceramic cap and said first and said second resin members providing a sealed package containing said circuit chip and said terminal, said wiring unit extending outwardly from between said first and said second resin members and providing a copper contact from said terminal to the outside of said package.

2. The package device of claim 1 wherein said plastic substrate is polypyromellitimide, a polyimide plastic.

3. The packaged device of claim 1 wherein said copper strips have a 25 percent stretch factor, said wiring unit has at least one hole therethrough, and wherein said at least one of said copper strips is bonded through said hole to said terminal.

4. The packaged device of claim 1 wherein said plastic substrate is polypyromellitimide, said copper strips have a 25 percent stretch factor, said wiring unit has at least one hole therethrough, and wherein said at least one of said copper strips is bonded through said hole to said terminal.

* * * * *